United States Patent [19]

Fujimoto et al.

[11] Patent Number: 5,097,317
[45] Date of Patent: Mar. 17, 1992

[54] RESIN-SEALED SEMICONDUCTOR DEVICE

[75] Inventors: Takamitsu Fujimoto; Shuichi Kita; Atsuko Noda; Hiroshi Koezuka, all of Amagasaki, Japan

[73] Assignee: Mitsubishi Denki Kabushiki Kaisha, Tokyo, Japan

[21] Appl. No.: 552,131

[22] Filed: Jul. 13, 1990

[30] Foreign Application Priority Data

Sep. 8, 1989 [JP] Japan .................. 1-234340

[51] Int. Cl.⁵ .................. C08K 3/34; C08K 3/00; H01L 23/28
[52] U.S. Cl. .................. 357/72; 357/67; 357/73; 357/80
[58] Field of Search .................. 357/70, 73, 80, 72, 357/74, 67

[56] References Cited

U.S. PATENT DOCUMENTS

| | | | |
|---|---|---|---|
| 4,633,573 | 1/1987 | Sherer | 357/72 |
| 4,720,424 | 1/1988 | Eickman et al. | 357/72 |
| 4,876,232 | 10/1989 | Barkatt | 502/417 |

FOREIGN PATENT DOCUMENTS

| | | |
|---|---|---|
| 60-14469 | 1/1985 | Japan . |
| 60-76562 | 5/1985 | Japan . |
| 60-180152 | 9/1985 | Japan . |
| 61-51854 | 3/1986 | Japan . |
| 62-68853 | 3/1987 | Japan . |
| 63-268261 | 11/1988 | Japan . |
| 63-275625 | 11/1988 | Japan . |
| 1-148766 | 6/1989 | Japan . |

OTHER PUBLICATIONS

The 38th Netsu-Koka-Sei-Jushi Koen-Toron-Kai Koen-Yoshi-Shu, pp. 123–126.
CHEMISTRY from Kagaku Dojin, vol. 44, No. 9, Sep. 1989, pp. 597–603, S. Sakka, "Sol-Gel Technique", (with partial English translation).

Primary Examiner—Andrew J. James
Assistant Examiner—Viet Q. Nguyen
Attorney, Agent, or Firm—Oblon, Spivak, McClelland, Maier & Neustadt

[57] ABSTRACT

A resin-sealed semiconductor device includes a semiconductor element mounted on a die frame, bonding wires and external wires connected to the bonding wires. The semiconductor element, the bonding wires and portions of the external leads are coated with porous silica gel impregnated with a sealing resin.

15 Claims, 1 Drawing Sheet

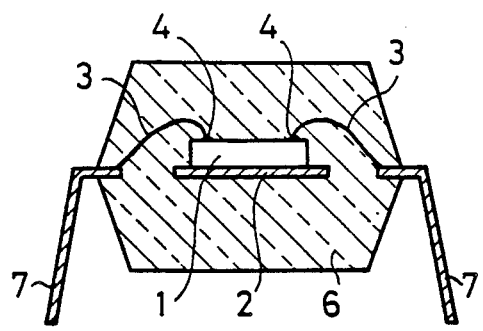
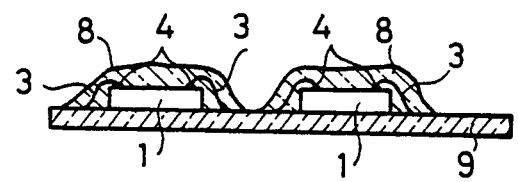
FIG. 1 PRIOR ART    FIG. 2 PRIOR ART
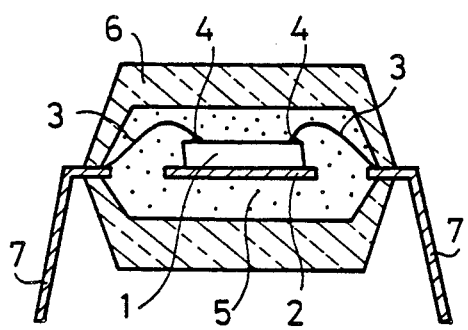
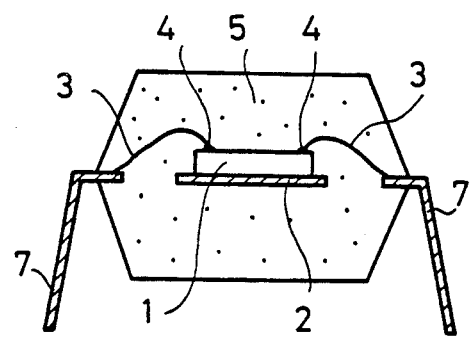
FIG. 3    FIG. 4
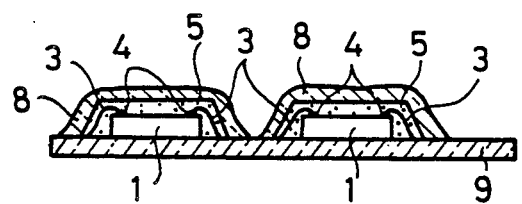
FIG. 5

RESIN-SEALED SEMICONDUCTOR DEVICE

This invention relates to a resin-sealed semiconductor device and, more particularly, to a resin-sealed semiconductor device in which a semiconductor element, bonding wires connecting the semiconductor element to external leads and portions of the external leads are covered with porous silica gel impregnated with a sealing resin.

BACKGROUND OF THE INVENTION

In semiconductor devices, such as IC's, LSI's and hybrid IC's, in order to protect semiconductor elements and external leads connected to bonding wires of the semiconductor elements against their environment, resin-sealing is widely employed, using silicone resin, epoxy resin, phenol resin or the like. FIG. 1 shows a cross-section of a conventional semiconductor device sealed with resin, which comprises a semiconductor element 1 mounted on a die frame 2 of, for example, Cu or Fe-Ni material, and Au bonding wires 3 which connect the semiconductor element 1 to external leads 7. The semiconductor element 1, the bonding wires 3 and the external leads 7 are sealed by a sealing resin 6, such as an epoxy resin.

In the above-described conventional resin-sealed semiconductor device, stress may be generated in a heat cycle due to difference in coefficient of linear expansion between the sealing resin 6 and the semiconductor element 1. Such as stress tends to cause problems such as deformation of fine aluminum conductors on the semiconductor element 1, cracking of a passivation coating, peeling off of bonding pads 4, cracking of the sealing resin 6, etc.

FIG. 2 shows a cross-section of a conventional hybrid IC sealed with a liquid silicone potting resin, which comprises a semiconductor elements 1 mounted on a ceramic substrate 9. The semiconductor elements 1 are connected to aluminum conductors or external leads (not shown) printed on the substrate 1 by means of Au bonding wires 3. Then, the semiconductor elements 1, the Au bonding wires 3 and the external leads are sealed with a liquid silicone potting resin 8. This semiconductor device also has problems similar to those of the device of FIG. 1, i.e. deformation of fine aluminum wires on the semiconductor element 1, cracking of a passivation coating, peeling off of bonding pads 4, etc.

Japanese Published Patent Application No. SHO 63-275625 discloses a semiconductor device which uses a sealing epoxy resin modified with silicone rubber to reduce the elasticity of the epoxy resin so that stress generated in the heat cycle may be reduced. Even such a silicone rubber-modified epoxy resin, however, cannot completely prevent stress from being generated during the heat cycle, and, therefore, this technique cannot adapt itself to manufacuring large-size semiconductor elements. In *The 38th Netsu-Koka-Sei-Jushi Ko-en-Toron-Kai Koen-Yoshi-Shu* (containing the abstracts of the lectures held on the 38th meeting for lectures and discussions on thermosetting resins), pages 123–126, a technique has been reported, according to which a large amount of inorganic filler is mixed with a sealing resin, whereby the coefficient of linear expansion of the sealing resin decreases, which, in turn, reduces stress generated during the heat cycle. However, with this technique, it is still impossible to match the coefficient of linear expansion of the semiconductor element and that of the sealing resin with each other, and, therefore, it is very difficult to suppress the generation of stress. Furthermore, mixing of a large quantity of inorganic filler to a sealing resin causes the viscosity of the resin to increase so that the moldability of the resin decreases.

Therefore, an object of the present invention is to provide a resin-sealed semiconductor device which is free of the above-described problems, and which has good thermal resistance, good humidity resistance and good thermal shock resistance, so that possibility of deformation of fine aluminum wires, cracking of a passivation film, cracking of sealing resin and the like is greatly reduced.

SUMMARY OF THE INVENTION

According to the present invention, a semiconductor element, bonding wires and portions of external leads connected to the bonding wires are covered with porous silica gel which has a coefficient of thermal expansion close to the coefficient of linear expansion of the semiconductor element, and the silica gel is impregnated with a sealing resin so as to fill the pores in the silica gel. Thus, the resin-sealed semiconductor devices with improved thermal shock resistance are provided without sacrificing heat and humidity resistance.

BRIEF DESCRIPTION OF THE DRAWINGS

FIG. 1 is a cross-sectional view of a first example of a conventional resin-sealed semiconductor device;

FIG. 2 is a cross-sectional view of a second example of a conventional resin-sealed semiconductor device in which a liquid silicon potting resin is used;

FIG. 3 is a cross-sectional view of a first embodiment of a resin-sealed semiconductor device according to the present invention;

FIG. 4 is a cross-sectional view of a second embodiment of a resin-sealed semiconductor device according to the present invention; and FIG. 5 is a cross-sectional view of a third embodiment of a resin-sealed semiconductor device according to the present invention.

DESCRIPTION OF PREFERRED EMBODIMENTS

Preferred embodiments of resin-sealed semiconductor devices of the present invention are now described with reference to FIGS. 3, 4 and 5.

In the first embodiment shown in FIG. 3, a semiconductor element 1 is mounted on a die-frame 2 of a suitable material such as Cu, its compounds, Ni-Fe or the like. The semiconductor element 1 may be connected to external leads 7 by, for example, Au bonding wires 3. The semiconductor element 1, the bonding wires 3 and portions of the external leads 7 are coated with porous silica gel impregnated with sealing resin to form a coating 5. Then, the sealing resin impregnated silica gel coating 5 is coated with sealing epoxy resin to form a coating 6. Because of the two-layered structure including the sealing resin impregnated silica gel coating 5 and the epoxy resin coating 6, the device has particularly high humidity resistance.

The coating is carried out by first coating the semiconductor element 1, the Au bonding wires and portions of the leads 7 with porous silica gel and then impregnating the silica gel coating 5 with a sealing resin, i.e. filling pores in the silica gel with the sealing resin. Thereafter, the outer surface of the silica gel coating 5 is coated with the coating 6 of the sealing epoxy resin.

In FIG. 4, a resin-sealed semiconductor device according to a second embodiment of the present invention is shown. This device is devoid of the sealing epoxy resin coating 6 over the outer surface of the resin-impregnated silica gel coating 5 of the device shown in FIG. 3. The device has a practically sufficient humidity resistance.

FIG. 5 shows a third embodiment of the present invention. Semiconductor elements 1, Au bonding wires 3 and external leads (not shown) printed on a ceramic substrate 9 are covered with a sealing-resin impregnated porous silica gel coating 5.

In the third embodiment, the semiconductor elements 1 are mounted on the ceramic substrate 9. The semiconductor elements 1 are connected to aluminum wires (not shown), or external leads, printed on the substrate 1 by means of the Au bonding wires 3. Then, the semiconductor elements 1, the Au bonding wires 3 and the external leads are coated with porous silica gel, the pores in the silica gel coating 5 are filled with a sealing resin, and a coating 8 of a liquid silicone potting resin is formed over the silica gel coating 5.

A feature of the resin-sealed semiconductor devices of the present invention described above is that the semiconductor elements 1, the Au bonding wires 3 and at least portions of the external leads are coated with porous silica gel impregnated with sealing resin. The porous silica gel to be impregnated with sealing resin is prepared by forming wet gel from a solution containing a porous silica gel material and forming dry gel from the wet gel. Thus, the semiconductor elements 1, the Au bonding wires 3 and the external leads connected to the bonding wires 3 are enclosed with a husk of porous silica gel.

In order to provide humidity resistance and strength to the structure, the husk is then impregnated with sealing resin.

The resin-sealed semiconductor devices coated with the resinimpregnated porous silica gel have not only good thermal shock resistance but also good heat resistance and good humidity resistance.

The term "semiconductor device" used herein means discrete semiconductor devices, such as diodes, transistors and thyristors, and other semiconductor devices including IC's, such as monolithic IC's and hybrid IC's, and also LSI's. The term "semiconductor element" used herein means diode elements, transistor elements thyristor elements, monolithic IC elements which constitute the major portions of the respective semiconductor devices, and also like elements in hybrid IC's. The term "bonding wires" used herein means elements for connecting the semiconductor element to the external leads, which may comprise gold, copper, aluminum or the like. The "bonding wires" may be bumps for use in a TAB (tape-automated-bonding) process. Such bonding wires are usually connected directly to inner portions of external leads, but they may be connected to inner portions of the external leads via wires on substrates as in the case of hybrid IC's.

The sealing resin which may be used in the present invention includes thermosetting resins, such as epoxy resin, silicone resin, phenol resin and polyimide resin, and thermoplastic resins, such as liquid crystal polymers and polyphenylene sulfide. An inorganic filler, such as silica powder, alumina powder and glass fiber, and other suitable additives may be added to the sealing resins. Further, the sealing resins may be diluted with an organic solvent, such as toluene, xylene, methyl ethyl ketone, methyl alcohol, or the like.

One example of manufacturing process for the porous silica gel usable in the present invention is described. An alkoxysilane, such as tetramethoxysilane and tetraethoxysilane, is hydrolized in the presence of alcohol and water, and is subjected to a condensation reaction at a temperature of from room temperature to 130° C., to produce wet gel. The wet gel is dried at 30° C.–130° C., and, then, heated to 150° C.–350° C. to produce the porous silica gel. As the above-stated alcohol, methyl alcohol, ethyl alcohol or the like may be used. The amount of alcohol to be added for 1 mol of alkoxysilane is within a range of from 1 to 6 mol, preferably, from 1.5 to 5 mol. The use of the amount of alcohol outside this range tends to cause cracking in the resulting porous silica gel and, therefore, it is not desirable. Water to be used is preferably ion-exchanged water or pure water and is added in an amount within a range of from 2 to 8 mol, preferably, from 3 to 7 mol, for 1 mol of alkoxysilane. Addition of water in an amount outside the above-stated range tends to cause undesirable cracking in the resulting porous silica gel. If necessary, hydrochloric acid or aqueous ammonia may be added for accelerating the hydrolytic action.

The step of drying the gel and the subsequent step of heating the dry gel to a temperature of 150° C. to 350° C. may be carried out under a reduced pressure.

In addition, if necessary, a metal alkoxide $M(OR)_n$ (M being a metal, such as Ba, Al and Ti, R being an alkyl radical in which the number of C is from 1 to 4, and n being the oxidation number of the metal), a silane compound, such as an epoxy silane compound, vinyl silane compound and phenyltrimethoxysilane, a water-soluble epoxy resin, an organic monomer, such as acrylate monomer and vinyl monomer, or a foaming agent may be added in an amount of less than 40 weight percent of $Si(OR)_4$ (R being an alkyl radical having from 1 to 4 carbon atoms).

The thus formed porous silica gel covers a semiconductor element and at least portions of external leads closer to the semiconductor element, and it forms a unity with the sealing resin. The term "unity" used herein means that the porous silica gel and the resin will not be separated at the interface therebetween even when the semiconductor device is subjected to the heat cycle, for example. The thickness of the porous silica gel coating should be enough to cover the semiconductor element and portions of the external leads closer to the semiconductor element, and it is usually about 1 mm or so. It should be appropriately determined depending on shapes of semiconductor elements to be sealed. The porous silica gel can be used as a passivation film for semiconductor elements.

Resin-sealed semiconductor devices of the present invention may be manufactured by, for example, coating the semiconductor element and portions of the external leads closer to the semiconductor element with the porous silica gel, and, then, the structure coated with the silica gel is sealed with a sealing resin, such as an epoxy resin. Prior to coating the portions of the semiconductor element and external lead portions with the porous silica gel, a silane coupling agent may be applied over them. The porous silica gel coating may be formed in the following manner. A mold is made of a silicone resin or a fluorine resin, such as polytetrafluoroethylene. A semiconductor element, external leads and porous silica gel materials are placed in the mold, and a semiconductor device coated with dry gel is formed in the mold. The device is removed from the mold and heated so that the device coated with the porous silica gel is completed. Sealing the thus prepared porous silica gel coated semiconductor device with resin may be carried out by transfer molding, reduced-pressure transfer molding (i.e. transfer molding using molds under reduced pressure), or injection molding, or applying powder of the sealing resin, or impregnation under vacuum.

Now, the resin-sealed semiconductor devices according to the present invention are described in further detail by contrasting Embodiments 1-3 to Comparisons 1 and 2.

PREPARATION OF POROUS SILICA GEL MATERIAL SOLUTION

Examples 1-6 of Silica Gel Material Mixture Solutions

The mixture solutions from which porous silica gel for coating semiconductor elements and conductor members associated therewith were prepared with the constituents and the mixing ratios shown in Table I. Each of the Examples 1, 2, 4, 5 and 6 was prepared by placing all the materials except pure water in a 200 cc four-necked flask provided with a reflux condenser, and stirring the materials in the flask at room temperature, while dropping pure water in 30 minutes. The Example 3 was prepared by placing the quantities of tetraethoxysilane and titanium isopropoxide in a 200 cc four-necked flask with a reflux condenser, and stirring them at room temperature, while dropping ethyl alcohol and pure water in two hours. (The amounts shown in Table I are all in part by weight.)

TABLE I

|  | Examples | | | | | |
| --- | --- | --- | --- | --- | --- | --- |
|  | 1 | 2 | 3 | 4 | 5 | 6 |
| Tetraethoxysilane | 20.8 | — | 19 | 20.8 | 20.8 | 20.8 |
| Tetramethoxysilane | — | 15.2 | — | — | — | — |
| Titanium Isopropoxide | — | — | 1.8 | — | — | — |
| Epoxysilane* | — | — | — | 0.05 | — | — |
| Phenyltrimethoxysilane | — | — | — | — | 0.1 | — |
| Ethyl alcohol | 22.1 | 22.1 | 22.1 | 22.1 | 22.1 | 7 |
| Pure water | 11.7 | 11.7 | 11.7 | 11.7 | 11.7 | 6 |

*KBM403: epoxysilane commerically available from Shin-Etsu Chemical Co. Ltd.

EMBODIMENT 1

A semiconductor element 1 mounted on a die frame 2, Au bonding wires 3 and portions of an inner section of a lead frame 7 closer to the semiconductor element 1, such as ones shown in FIG. 3, were placed in a mold of silicone resin. Respective ones of the mixture solutions of Examples 1, 3, 4 and 5 were poured into molds containing such semiconductor elements and other components as described above. The molds were heated to 60° C. for 10 hours, so that wet gel resulted. Then, a portion of the silicone mold was opened, and the mold was heated to 120° C. for 12 hours, so that dry gel resulted. After that, the molds were heated to 150° C. for 3 hours under a pressure of 1 atm and, then, heated to 200° C. for 10 hours under a pressure of 5 mmHg, which resulted in porous silica gel coatings. Then the silicone molds were removed. After that, the porous silica gel coatings, together with the remaining portions of the inner section of the lead frame 7, were sealed with a coating 6 of commercially available sealing epoxy resin.

EMBODIMENT 2

The second embodiment of the invention is shown in FIG. 4. Semiconductor devices of this second embodiment were made by first applying γ-glycidoxypropyl-trimethoxysilane over a semiconductor element 1 mounted on a die frame 2, Au bonding wires 3 and portions of the inner section of a lead frame 7, and placing them in a silicone mold. Respective ones of the mixture solutions of Examples 2, 4, 5 and 6 were poured into molds containing the above-described components. Porous silica gel coatings were formed by similar steps under similar conditions to Embodiment 1. The porous silica gel coatings were then vacuum-impregnated with a commercially available liquid silicone potting resin. The liquid silicone potting resin was thermally cured by heating the devices at 150° C. for 4 hours.

EMBODIMENT 3

The third embodiment is shown in FIG. 5. A hybrid IC shown comprises semiconductor elements 1 mounted on a ceramic substrate 9, the elements 1 being electrically connected by means of Au bonding wires 3 to aluminum wires or external leads (not shown) printed on the ceramic substrate 9. Such hybrid IC's were placed in silicone molds. The mixture solutions of Examples 1 and 4 were poured in the silicone molds, and porous silica gel coatings were formed under similar conditions as Embodiment 1. Then, the devices were sealed with a coating 8 of a commercially available liquid silicone potting resin.

Comparison 1

Resin-sealed semiconductor devices of the conventional type shown in FIG. 1 were prepared by sealing a semiconductor element 1 mounted on a die frame 2, together with Au bonding wires and the inner sections of a lead frame 7, with a coating 6 of a commercially available epoxy resin.

Comparison 2

Sealed hybrid IC's of the conventional type shown in FIG. 2 were prepared. Each of the IC's comprises semiconductor elements 1 mounted on a ceramic substrate 9, and the semiconductor elements 1 are electrically connected by Au bonding wires 3 to associated aluminum wires or external leads (not shown) printed on the substrate 9. The hybrid IC's were sealed with a commercially available liquid silicone potting resin.

The thus prepared various semiconductor devices were subjected to heat-resistance tests, humidity-resistance tests and thermal shock resistance tests which were conducted under the following conditions. The results were shown in Table II.

Heat-Resistance Tests

Semiconductor devices were left in air at 200° C., and time periods before defects were produced in the semiconductor elements were measured.

Humidity-Resistance Tests

Semiconductor devices were placed in a PCT (pressure cooker test) apparatus which was held at 121° C. at 2 atm, and time periods before defects were produced in the semiconductor elements were measured.

Thermal Shock Resistance Tests

Twenty (20) of each semiconductor device were subjected to 200 thermal test cycles. In each cycle, semiconductor devices were held at −65° C. for 30 minutes and then held at 150° C. for 30 minutes. After the completion of 200 cycles, the number of defective semiconductor devices was counted.

TABLE II

|   | Embodiment 1 Solution used | | | | Embodiment 2 Solution used | | | | Embodiment 3 Solution used | | Comp. | Comp. |
|---|---|---|---|---|---|---|---|---|---|---|---|---|
|   | Ex. 1 | Ex. 3 | Ex. 4 | Ex. 5 | Ex. 2 | Ex. 4 | Ex. 5 | Ex. 6 | Ex. 1 | Ex. 4 | 1 | 2 |
| A | 800 | 780 | 830 | 850 | 780 | 860 | 880 | 770 | 300 | 350 | 760 | 290 |
| B | 1,000 | 950 | 1,050 | 1,100 | 950 | 1,050 | 1,100 | 950 | 150 | 180 | 900 | 130 |
| C | 0 | 0 | 0 | 0 | 0 | 0 | 0 | 0 | 2 | 1 | 8 | 16 |

A: Time (hour) before defects were produced in semiconductor elements, in the heat-resistance test.
B: Time (hour) before defects were produced in semiconductor elements, in the humidity-resistance test.
C: Number of defective semicondutor elements after the completion of the thermal shock resistance test.

As is seen from Table II, according to the present invention, resin-sealed semiconductor devices with high thermal shock resistance can be provided without sacrificing heat-resistance and humidity-resistance.

What is claimed is:

1. A resin-sealed semiconductor device comprising a semiconductor element mounted on a die frame, and bonding wires for connecting said semiconductor element to external leads;
   wherein said semiconductor element, said bonding wires and portions of said external leads connected to said bonding wires are coated with a husk of porous silica gel which then is impregnated with a sealing resin.

2. A resin-sealed semiconductor device comprising a semiconductor element mounted on a die frame, and bonding wires for connecting said semiconductor element to external leads;
   wherein said semiconductor element, said bonding wires and portions of said external leads connected to said bonding wires are coated with a husk of porous silica gel which then is impregnated with a sealing resin, and, then, further coated with a sealing epoxy resin.

3. A resin-sealed semiconductor device according to claim 1 or 2 wherein said porous silica gel impregnated with a sealing resin has a coefficient of linear expansion closer to that of said semiconductor element.

4. A resin-sealed semiconductor device according to claim 1 or 2 wherein said semiconductor device is selected from the group consisting a diode element, a transistor element, a thyristor element, or at least one such element in monolithic IC's and hybrid IC's.

5. A resin-sealed semiconductor device according to claim 1 or 2 wherein said porous silica gel is prepared by hydrolyzing an alkoxysilane, in the presence of alcohol and water, condensing the hydrolyzation product at a temperature of from room temperature to 130° C. to produce wet gel, and, thereafter, heating said wet gel at a temperature of from 130° C. to 350° C.

6. A resin-sealed semiconductor device according to claim 5 wherein, as said alcohol, from 1 to 6 mol of methyl or ethyl alcohol is added for 1 mol of alkoxysilane.

7. A resin-sealed semiconductor device according to claim 5 wherein from 2 to 8 mol of water is added for 1 mol of alkoxysilane.

8. A resin-sealed semiconductor device according to claim 7 wherein at least one member selected from the group consisting of a metal alkoxide expressed by $M(OR)_n$ (where M is a metal, selected from the group consisting of Ba, Al and Ti, R is an alkyl radical having 1–4 carbon atoms, and n is the oxidation number of the metal), an epoxy silane resin, a vinyl silane resin, a water-soluble epoxy resin, an organic monomer selected from the group consisting of acrylate monomer and vinyl monomer, and a foaming agent, is added to the alkoxysilane.

9. A resin-sealed semiconductor device according to claims 1 or 2 wherein said porous silica gel is impregnated with a sealing resin selected from the group consisting of thermosetting resins and thermoplastic resins.

10. A resin-sealed semiconductor device according to claim 9 wherein said sealing resin contains an inorganic filler.

11. A resin-sealed semiconductor device according to claim 9 wherein a sealing resin diluted with an organic solvent is used.

12. The resin-sealed semiconductor device according to claim 7 wherein said alkoxysilane is selected from the group consisting of tetramethoxysilane and tetraethoxysilane.

13. The resin-sealed semiconductor device according to claim 9 wherein said sealing resin is selected from the group consisting of epoxy resins, silicone resins, phenol resins, polyimide resins, liquid crystal polymers, and polyphenylene sulfides.

14. The resin-sealed semiconductor device according to claim 10 wherein said inorganic filler is selected from the group consisting of silica powder, alumina powder and glass fiber.

15. The resin-sealed semiconductor device according to claim 11 wherein said organic solvent is selected from the group consisting of toluene, xylene, methyl ethyl ketone and ethyl alcohol.

* * * * *

UNITED STATES PATENT AND TRADEMARK OFFICE
CERTIFICATE OF CORRECTION

PATENT NO. : 5,097,317
DATED : March 17, 1992
INVENTOR(S) : Takamitsu Fujimoto, et al.

It is certified that error appears in the above-identified patent and that said Letters Patent is hereby corrected as shown below:

Column 1, line 31, replace "as", with --a--.

Column 2, line 16, replace "semicoductor", with --semiconductor--.

Column 3, line 40, replace "resinimpregnated", with --resin-impregnated".

Claim 4, line 3, insert after "consisting", --of--.

Claim 8, line 2, replace "7", with --5--.

Claim 12, line 2, replace "7", with --5--.

Signed and Sealed this

Sixth Day of July, 1993

Attest:

MICHAEL K. KIRK

*Attesting Officer*    Acting Commissioner of Patents and Trademarks